(12) United States Patent
Chen et al.

(10) Patent No.: US 9,036,669 B2
(45) Date of Patent: May 19, 2015

(54) OBTAINING NARROW LINE-WIDTH, FULL C-BAND TUNABILITY MIRROR FOR MONOLITHIC OR HYBRID INTEGRATED LASERS

(71) Applicant: Futurewei Technologies, Inc., Plano, TX (US)

(72) Inventors: Hongmin Chen, Davis, CA (US); Hongbing Lei, San Jose, CA (US); Xiao A. Shen, San Bruno, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/025,298

(22) Filed: Sep. 12, 2013

(65) Prior Publication Data
US 2015/0071314 A1    Mar. 12, 2015

(51) Int. Cl.
*H01S 3/10*    (2006.01)

(52) U.S. Cl.
CPC .................................. *H01S 3/10069* (2013.01)

(58) Field of Classification Search
CPC ..... H01S 3/1055; H01S 5/0265; H01S 5/142; H01S 3/0675; H01S 3/10053; H01S 5/06256; H01S 3/10; H01S 5/0612; H01S 3/08009; H01S 3/10007
USPC .......................................... 372/20, 26, 96, 99
See application file for complete search history.

(56) References Cited

U.S. PATENT DOCUMENTS

| | | | | |
|---|---|---|---|---|
| 2005/0244994 | A1* | 11/2005 | Meliga et al. ................... | 438/22 |
| 2009/0154505 | A1* | 6/2009 | Oh et al. .......................... | 372/20 |
| 2010/0142567 | A1* | 6/2010 | Ward et al. ...................... | 372/20 |
| 2011/0243491 | A1* | 10/2011 | Hashimoto ....................... | 385/3 |
| 2012/0057079 | A1* | 3/2012 | Dallesasse et al. ............ | 348/724 |
| 2013/0209021 | A1* | 8/2013 | Hayashi et al. .................. | 385/2 |
| 2013/0235890 | A1* | 9/2013 | Creazzo et al. ................. | 372/20 |
| 2013/0243013 | A1* | 9/2013 | Yoon et al. ....................... | 372/20 |

OTHER PUBLICATIONS

Coldren, L., et al., "Diode Lasers and Photonic Integrated Circuits," Second Edition, ISBN 978-470-4412-8, Wiley Series in Microwave and Optical Engineering, 735 pages.
Tanaka, et al., "Highly-Efficient, Low-Noise Si Hybrid Laser Using Flip-Chip Bonded SOA," IEEE Optical Interconnects Conference, 2012, pp. 12-13.

(Continued)

*Primary Examiner* — Colleen A Matthews
*Assistant Examiner* — Delma R Forde
(74) *Attorney, Agent, or Firm* — Conley Rose, P.C.; Grant Rodolph; Jonathan K. Polk

(57) ABSTRACT

An apparatus comprising an optical medium, a power splitter coupled to the optical medium, a first delay line coupled to the power splitter such that the power splitter is positioned between the first delay line and the optical medium, a first comb reflector coupled to the first delay line such that the first delay line is positioned between the first comb reflector and the power splitter, and a second comb reflector coupled to the power splitter but not the first comb reflector and not the first delay line. A method comprising receiving an optical signal, splitting the optical signal into a first split optical signal and a second split optical signal, delaying the first split optical signal, tuning the delayed first split optical signal, tuning the second split optical signal, and delaying the tuned second split optical signal.

31 Claims, 8 Drawing Sheets

(56) References Cited

OTHER PUBLICATIONS

Wesstrom, et al., "Design of a Widely Tunable Modulated Grating Y-Branch Laser Using the Additive Vernier Effect for Improved Super-Mode Selection," IEEE 18th International Semiconductor Laser Conference, 2002, pp. 99-100.

Nemoto, et al., "Narrow Spectral Linewidth Wavelength Tunable Laser with Si Photonic-Wire Waveguide Ring Resonators," IEEE, pp. 216-218.

Jayaraman, et al., "Theory, Design, and Performance of Extended Tuning Range Semiconductor Lasers with Sampled Gratings," IEEE Journal of Quantum Electronics, vol. 29, No. 6, Jun. 1993, pp. 1824-1834.

Fujioka, et al., "Compact and Low Power Consumption Hybrid Integrated Wavelength Tunable Laser Module Using Silicon Waveguide Resonators," Journal of Lightwave Technology, vol. 28, No. 21, Nov. 1, 2010, pp. 3115-3120.

Lee, et al., "Integration of Semiconductor Laser Amplifiers with Sampled Grating Tunable Lasers for WDM Applications," IEEE Journal of Selected Topics in Quantum Electronics, vol. 3, No. 2, Apr. 1997, pp. 615-627.

* cited by examiner

OBTAINING NARROW LINE-WIDTH, FULL C-BAND TUNABILITY MIRROR FOR MONOLITHIC OR HYBRID INTEGRATED LASERS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Tunable laser sources (TLS) have been widely used in optical communication. Generally TLS are fabricated on an Indium Phosphide (InP) substrate platform, typically by butt-joining of a gain chip (or gain section) with a passive section, wherein the passive section may comprise one or more laser mirrors. The gain section may have a band gap close to a target lasing wavelength, and may provide gain through current injection. The passive section (and therefore laser mirrors) may comprise a higher band gap energy than the lasing wavelength and low absorption loss to provide wavelength tuning for the laser. In some cases, is may be desired to have full C-band tuning (e.g., wavelengths between about 1,528 to 1,568 nanometers). It also may be desired to maintain a high side-mode suppression ratio (SMSR) in the laser. Additionally, it may be advantageous to have independent control of the output power and wavelength of the laser, such as when using a tunable laser in a wavelength-division multiplexing (WDM) network.

SUMMARY

In one embodiment, the disclosure includes an apparatus comprising an optical medium, a power splitter coupled to the optical medium, a first delay line coupled to the power splitter such that the power splitter is positioned between the first delay line and the optical medium, a first comb reflector coupled to the first delay line such that the first delay line is positioned between the first comb reflector and the power splitter, a second comb reflector coupled to the power splitter but not the first comb reflector and not the first delay line, a second delay line coupled to the second comb reflector such that the second comb reflector is positioned between the second delay line and the input splitter, an output combiner coupled to the first comb reflector and the second delay line, and an output optical medium coupled to the output combiner, such that the output combiner is positioned between the first comb reflector and the optical medium.

In another embodiment, the disclosure includes an apparatus comprising a laser phase section, and a laser mirror coupled to the laser phase section and configured to: apply a current according to a look up table to a gain chip; apply current to a first heater according to a look up table so the wavelength of one of the peaks of a first comb reflector is aligned to a target wavelength; apply current to a second heater according to a look up table so the wavelength of one of the peaks of a second comb reflector is aligned to the target wavelength; apply current to a third heater according to a look up table to adjust the phase of a first delay line so that the reflected signal from the first comb reflector and the second comb reflector have constructive interference at the target wavelength; apply current to a phase section so the lasing wavelength is the target wavelength; and apply current to a fourth heater to adjust the phase of a second delay line, so the output power is adjusted to a target output power.

In yet another embodiment, the disclosure includes a method comprising setting the laser temperature according to a calibration table, applying a current according to a look up table to a gain chip, applying current to a first heater according to a look up table so the wavelength of one of the peaks of a first comb reflector is aligned to a target wavelength, applying current to a second heater according to a look up table so the wavelength of one of the peaks of a second comb reflector is aligned to the target wavelength, applying current to a third heater according to a look up table to adjust the phase of a first delay line so that the reflected signal from the first comb reflector and the second comb reflector have constructive interference at the target wavelength, applying current to a phase section so the lasing wavelength is the target wavelength, and applying current to a fourth heater to adjust the phase of a second delay line, so the output power is adjusted to a target output power.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are apparatuses and methods for obtaining narrow line-width, full C-band tunability in a mirror for a monolithic or hybrid integrated laser. Specifically, the effective length of a passive section of the laser may be increased to reduce the line width. Additionally, the disclosed embodiments allow control of the output power of the laser without adjusting the current through a gain section of the laser. Also, instead of the traditionally used monolithically integrated tunable laser on an Indium Phosphide (InP) carrier or platform, a hybrid integrated approach based on a silicon-on-insulator (SOI) platform may be used herein for photonic integration. In an embodiment, the InP platform may be used to monolithically grow an optical component comprising one or more optical sub-components. For example, parts of a laser array based on comb reflectors may be grown on the InP platform. In some embodiments, the laser may comprise at least two comb reflectors coupled to delays. Further, the InP platform may be coupled to other optical devices, e.g., via a flip-chip bonding method. The wavelengths of the laser may be tunable by thermally or electrically tuning the comb reflectors. In addition, passive flip-chip bonding may align optical waveguides with the help of vertical stoppers as well as horizontal markers. Moreover, mode convertors may be used to improve optical coupling between silicon-on-insulator (SOI) waveguides and the coupled optical device.

Figure 1:
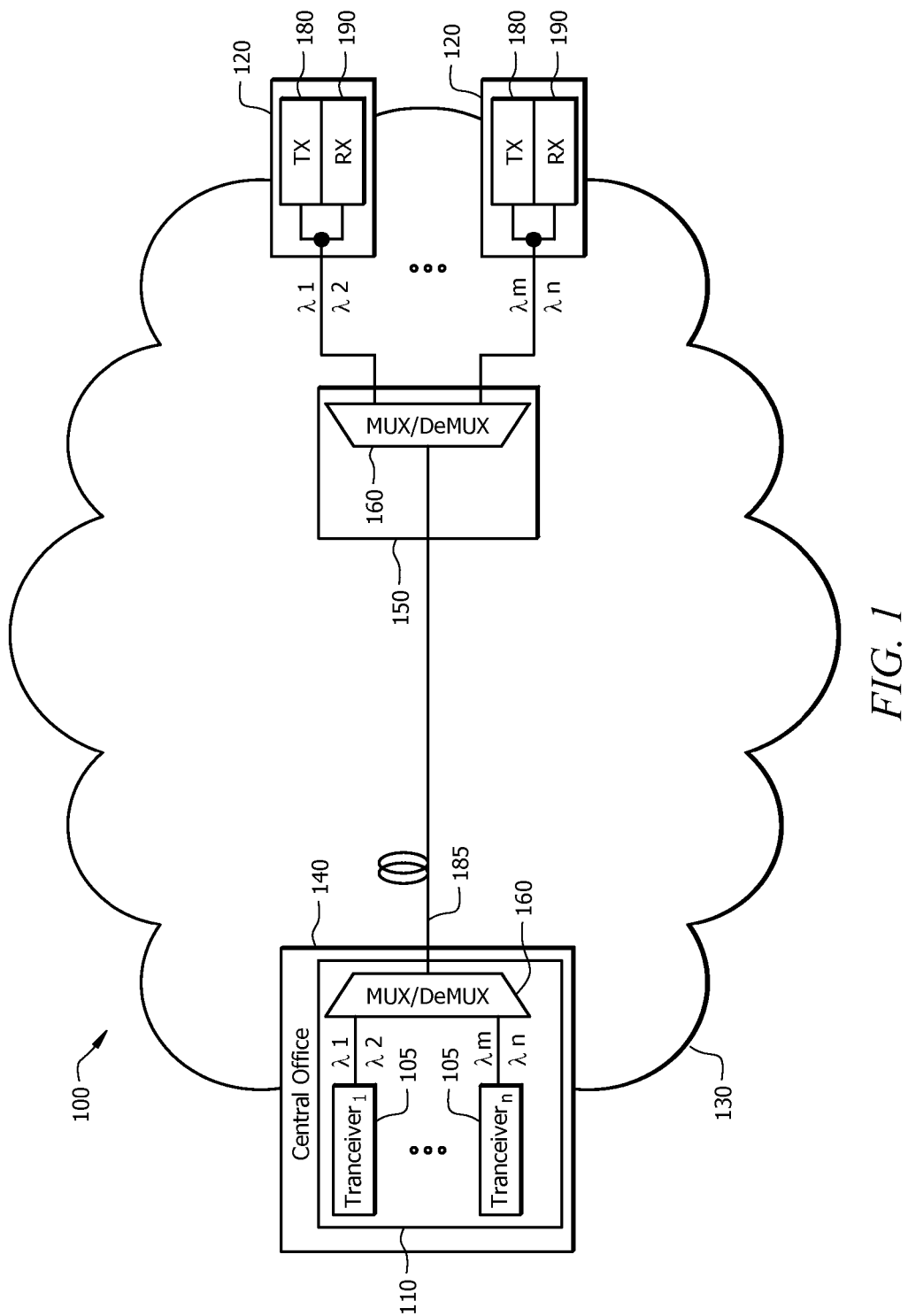
FIG. 1 is a schematic diagram of a TDM/WDM PON.

FIG. 1 is a schematic diagram of a time and wavelength division multiplexed (TWDM) passive optical network (PON) 100. The PON 100 may comprise an optical line terminal (OLT) 110 located in a central office (CO) 140, one or more optical network units (ONU) 120 located at the customer premises, and an optical distribution network (ODN) 130 that couples the OLT 110 to the ONU 120. The PON 100 may provide wavelength division multiplexing (WDM) capability by associating a downstream wavelength and an upstream wavelength with each transceiver 105 in the OLT 110 so that a plurality of wavelengths are present, combining those wavelengths into a single optical fiber cable 185, and distributing the plurality of wavelengths to a subset of the ONUs 120 through one or more remote node (RN) 150. The PON 100 may provide time division multiple access (TDMA) capability for each subset of ONUs 120 associated with an OLT 110. While a PON 100 is illustrated in FIG. 1, it will be appreciated that the optical components described herein can be used in any optical system or network.

The PON 100 may be a communications network that does not require any active components to distribute data among the OLT 110, RNs 150, and ONUs 120. Instead, the PON 100 may use the passive optical components in the ODN 130 to distribute data among the OLTs 110, RN 150, and ONUs 120. The PON 100 may be a Next Generation Access (NGA) system, such as a 10 Gb/s (gigabit per second) GPON (or gigabit passive optical network) (e.g., XGPON), which may have a downstream bandwidth of about 10 Gb/s and an upstream bandwidth of about 2.5 Gb/s. Alternatively, the PON 100 may be any Ethernet-based network, such as an EPON (or Ethernet passive optical network) defined by the Institute of Electrical and Electronics Engineers (IEEE) 802.3ah standard, a 10 Gb EPON as defined by the IEEE 802.3av standard, an APON, a BPON defined by the International Telecommunications Union (ITU) Telecommunications Standardization Sector (ITU-T) G.983 standard, a GPON defined by the ITU-T G.984 standard, a WDM PON (WPON), or a suitable after-arising technology, all of which are incorporated by reference as if reproduced in their entirety.

The CO 140 may be a physical building and may comprise servers and other backbone equipment (not shown) designed to service a geographical area with data transfer capability. The CO 140 may comprise a plurality of transceivers 105 and at least one multiplexer/demultiplexer (MUX/DeMUX) 160. The MUX/DeMUX 160 may be any suitable wavelength separator/combiner such as an arrayed waveguide grating (AWG). The MUX/DeMUX 160 at the CO 140 may combine the various wavelengths from the transceivers 105 into a single line to feed into the RN 150.

The OLT 110 may be any device configured to communicate with the ONUs 120 and another network (not shown). Specifically, the OLT 110 may act as an intermediary between the other network and the ONUs 120. For instance, the OLT 110 may forward data received from the network to the ONUs 120, and forward data received from the ONUs 120 to the other network. Although the specific configuration of the OLT 110 may vary depending on the type of PON 100, in an embodiment, the OLT 110 may comprise a transmitter and a receiver. When the other network uses a network protocol, such as Ethernet or Synchronous Optical Networking/Synchronous Digital Hierarchy (SONET/SDH), which differs from the PON protocol used in the PON 100, the OLT 110 may comprise a converter that converts the network protocol into the PON protocol. The OLT 110 converters may also convert the PON protocol into the network protocol. The OLT 110 may be typically located at a central location, such as the CO 140, but may be located at other locations as well.

The ODN 130 may be a data distribution system, which may comprise optical fiber cables 185, couplers, splitters, distributors, and/or other equipment. In an embodiment, the optical fiber cables 185, couplers, splitters, distributors, and/or other equipment may be passive optical components. Specifically, the optical fiber cables 185, couplers, splitters, distributors, and/or other equipment may be components that do not require any power to distribute data signals between the OLTs 110 and the ONUs 120. Alternatively, the ODN 130 may comprise one or a plurality of active components, such as optical amplifiers and/or power splitters. The ODN 130 may typically extend from the OLTs 110 to the ONUs 120 in a branching configuration as shown in FIG. 1, but may be alternatively configured in any other point-to-multipoint configuration.

The RN 150 may be any component positioned within the ODN 130 that provides partial reflectivity, polarization rotation, and/or WDM capability. For example, the RN 150 may comprise a MUX/DeMUX 160. The MUX/DeMUX 160 may be any suitable wavelength separator/combiner such as an AWG. The RN 150 may exist closer to the ONUs 120 than to the CO 140, for example, at the end of a road where multiple users reside, but the RN 150 may also exist at any point in the ODN 130 between the ONUs 120 and the CO 140.

The ONUs 120 may be any devices that are configured to communicate with the OLT 110 and a customer or user (not shown). Specifically, the ONUs 120 may act as an intermediary between the OLT 110 and the customer. For instance, the ONUs 120 may forward data received from the OLT 110 to the customer and forward data received from the customer to the OLT 110 via the RN 150. Although the specific configuration of the ONUs 120 may vary depending on the type of PON 100, the ONUs 120 may comprise an optical transmitter 180 (e.g. laser) configured to send optical signals to the OLTs 110 and an optical receiver 190 configured to receive optical signals from the OLTs 110. In some embodiments, the transmitter 180 and receiver 190 may be combined into a transceiver. Additionally, the ONUs 120 may comprise a converter that converts the optical signal into electrical signals for the customer, such as signals in the Ethernet or asynchronous transfer mode (ATM) protocol, and a second transmitter and/ or receiver that may send and/or receive the electrical signals to a customer device. In some embodiments, ONUs 120 and optical network terminals (ONTs) are similar, and thus the terms are used interchangeably herein. The ONUs 120 may be typically located at distributed locations such as the customer premises, but may be located at other locations as well. In some embodiments, tunable lasers may be used in other optical telecommunication networks, as well.

Figure 2:
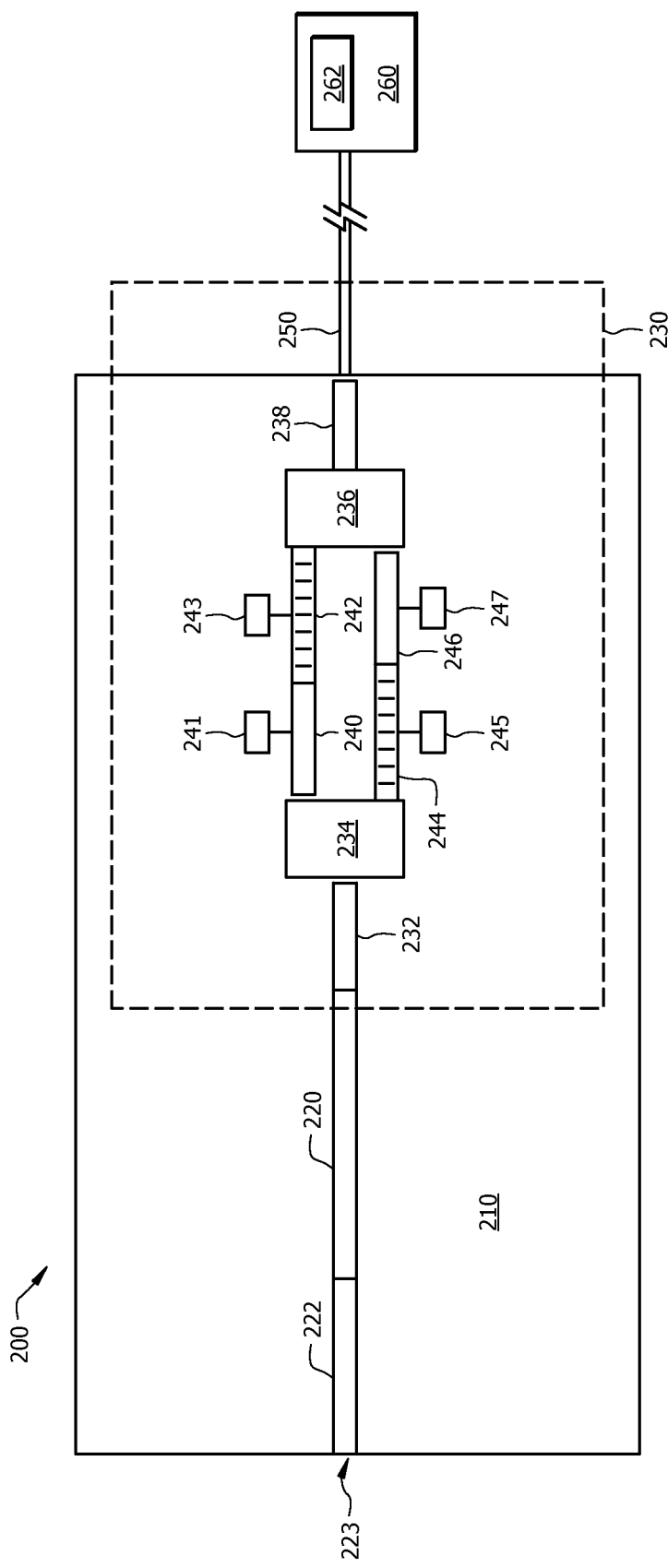
FIG. 2 is a schematic diagram of an embodiment of an optical assembly comprising an InP substrate platform.

FIG. 2 is a schematic diagram of an embodiment of an optical assembly 200, which may comprise at least two comb reflectors. The optical assembly 200 may communicate with additional optical components 262, wherein the optical components 262 may be fabricated or grown on a separate platform 260. In some embodiments, the optical assembly 200 may comprise a carrier or platform 210 (wherein the platform may be an Indium Phosphide (InP) platform). Additionally, the optical assembly 200 may comprise a laser mirror 230 comprising one or more optical components, wherein the laser mirror 230 may be monolithically fabricated or grown on the InP platform 210. FIG. 2 may be considered a top view of the optical assembly 200, assuming that the InP platform 210 is situated underneath the gain chip 220. As used herein, "top", "bottom", "front", "back", "left", "right", "inner", "outer", or any other term that references a relative position is with respect to the perspective view referenced and does not mean to imply that a device is restricted to only one orientation. The InP platform 210 may be part of a chip or wafer.

In some embodiments, the platform 210 may comprise a back mirror 223, a laser phase section 222 coupled to the back mirror 223, and a gain chip 220 coupled to the phase section 222. Specifically, the gain chip 220 may be coupled to the phase section 222 such that the phase section 222 is positioned between the back mirror 223 and the gain chip 220, wherein the back mirror 223 comprises high-reflective coating.

In some embodiments, the laser mirror 230 may comprise an optical medium 232, a input splitter 234 coupled to the optical medium, a first delay line 240 coupled to the input splitter 234, a first comb reflector 242 coupled to the first delay line 240, a second comb reflector 244 coupled to the input splitter 234, a second delay line 246 coupled to the second comb reflector 244, a output combiner 236 coupled to both the first comb reflector 242 and the second delay line 246, an output optical medium (or output waveguide) 238, and an optical fiber output 250. In some embodiments, the optical medium 232 may comprise one or more of an input waveguide, a phase section, or another medium for directing an optical signal. The optical medium 232 may couple the gain chip 220 to the laser mirror 230.

In some embodiments, the input splitter 234 may receive an optical signal, via the optical medium 232, and may be operable to split the optical signal into a first optical signal and a second optical signal. In some embodiments, the first optical signal may be directed through the first delay line 240 and the first comb reflector 242, and the second optical signal may be directed through the second comb reflector 244 and the second delay line 246. The optical signal may be controlled or modified as it passes through the comb reflectors and delay lines, wherein thermal tuning at one or more of the comb reflectors and/or the delay lines may be used. For example, local temperature controls 241, 243, 245 and 247 may be coupled to the comb reflectors and/or delay lines. In some embodiments, the first comb reflector 242 and the second comb reflector 244 may each comprise one of: a sampled grating distributed Bragg reflector (DBR), a phase grating DBR, or any other reflector that provides two or more reflection peaks and low power loss. In some embodiments, the two comb reflectors 242 and 244 may comprise different comb spacing.

In some embodiments, the delay lines 240 and 246 may be operable to delay the reflections of the comb reflectors 242 and 244. Additionally, the length of the delay line 240 may be chosen to be long enough such that the delayed interference period is narrower than the spectrum width of the comb reflector(s), thus narrowing the reflected spectrum width. In some embodiments, the lengths of the delay lines may be greater than approximately 100 micrometers. In some embodiments, the lengths of the delay lines may range between 100 and 500 micrometers. In other embodiments, the length of the first delay line 240 may be approximately 435 micrometers, and the length of the second delay line 426 may be approximately 483.8 micrometers. In some embodiments, the delay line 246 may be used to tune the output power of the laser mirror 230. In some embodiments, the phase section 222 may be used for tuning as well. For example, current may be applied to the phase section 222 (or a heater coupled to the phase section 222) so the lasing wavelength is the target wavelength. The current on phase section 222 may be chosen according to a look up table or controlled with an external wavelength monitor.

In some embodiments, the length of the delay line(s) may be chosen such that when constructive interference occurs at the target wavelength, the destructive inference occurs at the crossing wavelength of the neighboring combs (of the comb reflectors), thereby suppressing reflection of the neighboring super mode. In some embodiments, the refractive index of one or more of the delay line 240 may be adjusted by local temperature tuning to create constructive inference for the light reflected from the comb reflectors 242 and 244. In some embodiments, the second delay line 246 may be used to control the output power of the laser mirror 230, wherein the refractive index of the second delay line 246 is adjusted through local temperature control.

In some embodiments, the output combiner 236 (or output power combiner), may be operable to combine the first and second optical signals through interference. The output signals from the first comb reflector 242 and the second delay line 246 may feed into the output combiner 236, and may be combined into a single signal to be emitted or transmitted out via the output optical medium (or output waveguide) 238. In some embodiments, the input splitter 234 and output combiner 236 may each comprise one of a multi-mode interface (MMI), a directional coupler, and/or a Y-branch splitter, or any other type of splitter or multiplexer, depending on the application or degree of integration. In some embodiments, the output combiner 236 may be coupled to the output optical medium 238, wherein the output optical medium 238 may comprise anti-reflective coating to prevent reflection back to the gain chip 220. In some embodiments, the output optical medium 238 may comprise an output waveguide.

The optical medium 232, the input splitter 234, the output combiner 236, the comb reflectors 242 and 244, the delay lines 240 and 246, and the output optical medium 238 collectively considered as the laser mirror 230, may be monolithically fabricated from the InP platform 210. Accordingly, the laser mirror 230 may be considered part of the InP platform 210. In other words, the InP platform 210 may comprise the laser mirror 230. Monolithic fabrication of the laser mirror may use any suitable technologies, e.g., via deposition, etching, and/or doping of an InP wafer. It should be understood that FIG. 2 merely serves as an application example of InP-based optical assembly. Thus, other designs or configurations of optical components and/or optical devices may also be similarly realized within scope of this disclosure.

The gain chip 220 may comprise any suitable material, e.g., a Group III-V compound. In an embodiment, the gain chip 220 may be made of indium phosphide (InP). The gain chip 220 may be mounted on the InP platform 210 via any suitable coupling method, such as a flip-chip bonding method, a butt-joint method, selective area growth technology, or an adiabatical coupling method. In some embodiments, the gain chip 220 may comprise a multiple quantum well (MQW), wherein the band gap energy may be proximate to a target lasing wavelength. In some embodiments, the target lasing wavelength may be approximately 1550 nanometers (nm). In some embodiments, the gain chip 220 may provide optical gain through current injection.

In operation, a laser may oscillate inside the laser cavity, and certain wavelength(s) of the laser may oscillate, with other wavelengths being suppressed. The phase section 222 may be adjusted to allow lasers of certain wavelength(s) to oscillate. In an embodiment, the phase section 222 may tune a phase by changing refractive index, e.g., via temperature change, current injection, or an electrical field. In some embodiments, the phase section 222 may align the cavity mode to a peak reflection defined by the laser mirror 230 and the back mirror 223. Similarly, the comb reflectors 242 and 244 may tune a wavelength via thermal tuning or electrical tuning. As such, the wavelength of the laser output by the optical assembly 200 may be mainly tuned or determined by the comb reflectors 242 and 244.

The configuration as shown in FIG. 2 may offer a tunable laser emitter or transmitter array with limited wavelength tuning capability, e.g., narrow band tuning in the range of about zero to eight nanometers (nm). Such a configuration may be ideal for dense wavelength division multiplexing (DWDM) applications, where fixed wavelengths are of interest. Additionally, the configuration may allow for full C-band tuning (e.g., wavelengths between about 1,528 to 1,568 nanometers).

As mentioned previously, a refractive index of the comb reflectors 242 and 244 may be changed, which in turn may accomplish tuning of the output wavelength of the laser. One option is to use thermal tuning. In thermal tuning, micro-sized heaters 241, 243, 245, and 247 may be traced or placed on top of the comb reflectors and/or the delay lines. For visual clarity, the electrical traces, electrodes, transmission lines, ground lines, termination resistors, etc., have been omitted in figures herein, unless pointed out specifically. During operation, current to the micro heaters may be adjusted or turned on or off as desired, which leads to temperature changes, then refractive index changes, and eventually wavelength changes. For example, a one degree Celsius temperature change may tune a laser wavelength by 0.1 nm.

In some embodiments, the two delay lines 240 and 246 and the two comb reflectors 242 and 244 may be considered as forming two arms of a Mach-Zehnder interferometer (MZI), wherein the first delay line 240 and the first comb reflector 242 form a first arm of the MZI, and the second comb reflector 244 and the second delay line 246 form a second arm of the MZI. In some embodiments, the lowest power loss may occur when the two arms of the MZI are symmetric. In other words, the combined length of the first delay line 240 and first comb reflector 242 may be equal to the combined length of the second comb reflector 244 and the second delay line 246. Additionally, the splitting ratio of the input splitter 234 and output combiner 236 may be approximately 50:50, and the peak reflectivity of the comb reflectors 242 and 244 may be equal.

Figure 3:
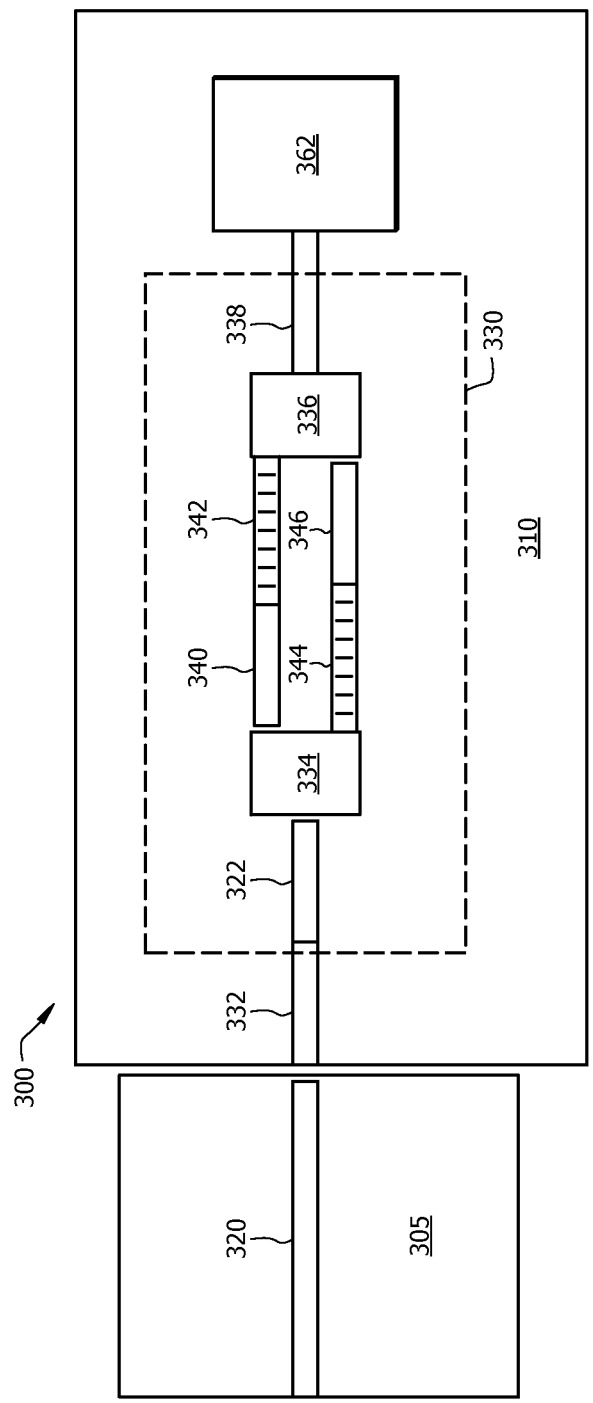
FIG. 3 is a schematic diagram of an embodiment of an optical assembly comprising an InP substrate platform and a silicon-on-insulator substrate platform.

FIG. 3 is a schematic diagram of an embodiment of another optical assembly 300, which has various aspects that are the same as or similar to the assembly 200. In the interest of conciseness, further descriptions may focus on the aspects that are different than the assembly 200, wherein the delay lines 340 and 346, the comb reflectors 342 and 344, and the output combiner 336 may be similar to the embodiment described in FIG. 2. In the embodiment shown in FIG. 3, the gain chip 320 may be grown on a platform 305 separate from the laser mirror 330, wherein the platform 305 may comprise an InP platform. In some embodiments, the platform 310 may comprise a Silicon (Si) substrate or silicon-on-insulator (SOI) platform, and the InP platform 305 and SOI platform 310 may be joined together via a butt coupling method. The gain chip 320 may comprise anti-reflective coating at the butt-joint with the SOI platform 310 and may comprise high-reflective coating at the end opposite the butt-joint with the SOI platform 310.

In the embodiment of FIG. 3, the positions of the gain chip 320, phase section 322, and optical medium 332 may vary from the configuration shown in FIG. 2. For example, the optical medium 332 (or input optical medium) may be coupled to the gain chip 320 at the butt-joint between the two platforms. Additionally, the phase section 322 may be coupled to the optical medium 332, such that the optical medium 332 is positioned between the gain chip 320 and the phase section 322. The phase section 322 may also be coupled to the input splitter 334, such that the phase section 322 is positioned between the optical medium 332 and the input splitter 334. In some embodiments, the optical medium 332 may comprise an input coupler. In the embodiment of FIG. 3, the optical components 362 coupled to the output optical medium 338 may be located on the SOI platform 310 rather than a separate platform (as shown in FIG. 2).

Figure 4A:
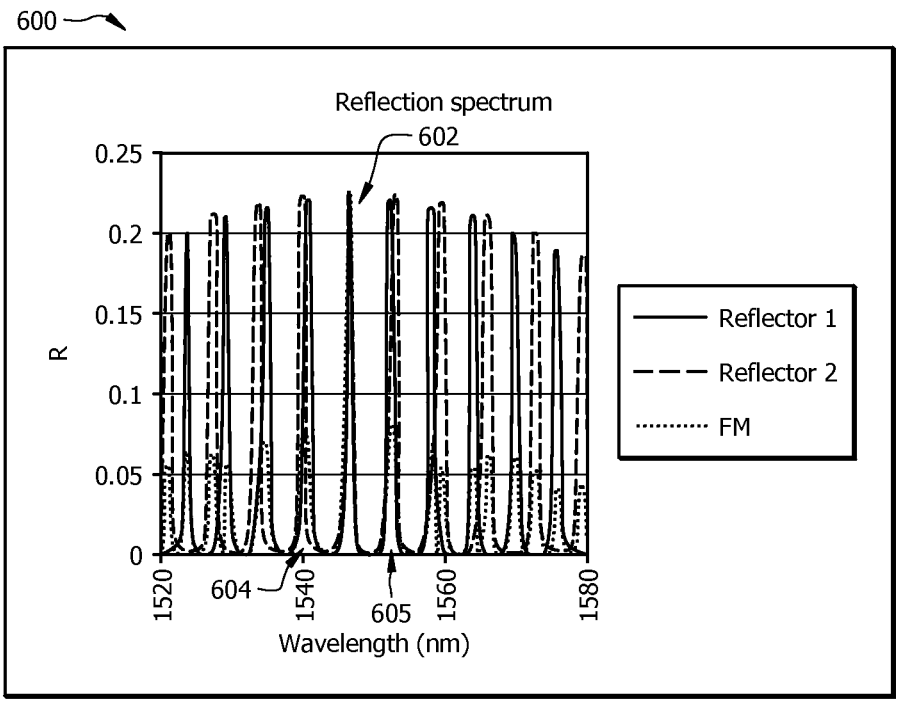
FIGS. 4A and 4B are graphs illustrating the reflection spectrum of a laser.
Figure 4B:
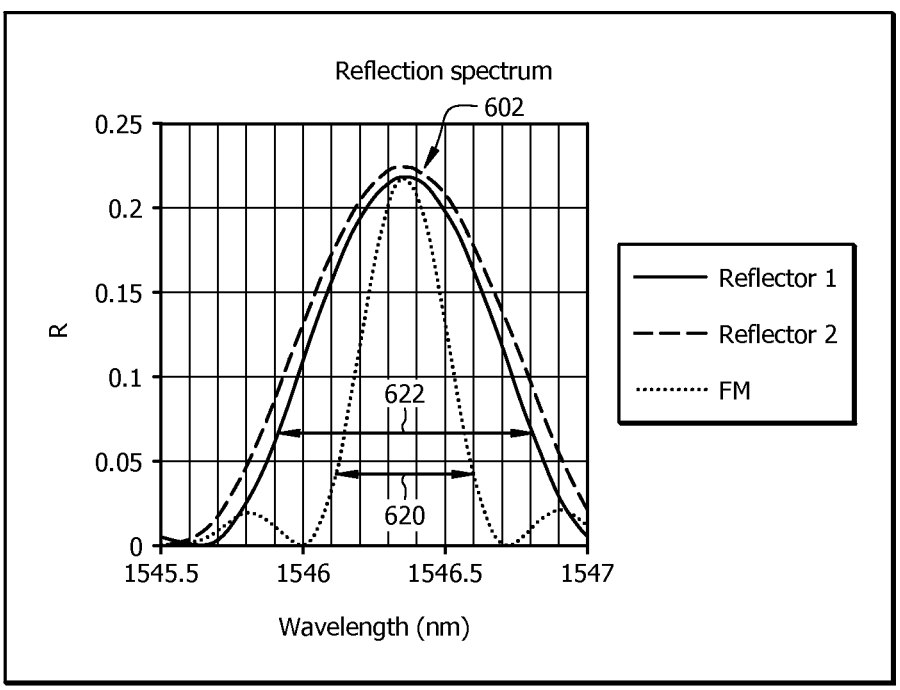

FIGS. 4A and 4B illustrate a graph of the reflection spectrum for the laser embodiment shown in FIG. 2, with reflectivity (R) on the y-axis and the wavelength in nanometers on the x-axis. FIG. 4B is the graph of FIG. 4A, wherein the scale of the x-axis has been changed from 1520-1580 nanometers to 1545.5-1547 nanometers. The graphs compare the first comb reflector 242 (Reflector 1), the second comb reflector 244 (Reflector 2), and the total laser mirror 230 (FM). The graph of FIG. 4A illustrates the side-mode suppression ratio (SMSR) between the center peak 602 and the nearest higher-order modes 604 and 605. The graph of FIG. 4B illustrates the reduction in width of the center peak 602 between the width 622 of the peaks for the individual comb reflectors and the width 620 of the peak for the total laser mirror 230. It can be seen from the graphs that the spectrum width of the laser mirror is narrower than an individual reflector. The narrow reflected spectrum width allows an increase in the total laser cavity length, such as the length of section 222 and/or 232, to reduce the line width of the laser, while at the same time maintaining the side mode suppression ratio above a specified limit.

Figure 5A:
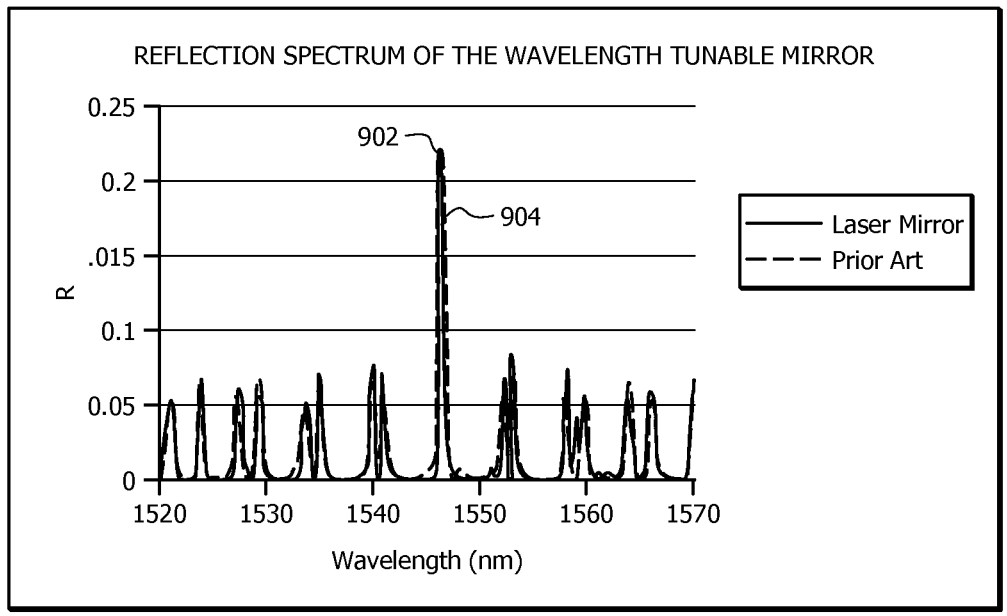
FIGS. 5A and 5B are graphs of a comparison between a disclosed embodiment and an example of prior art.
Figure 5B:
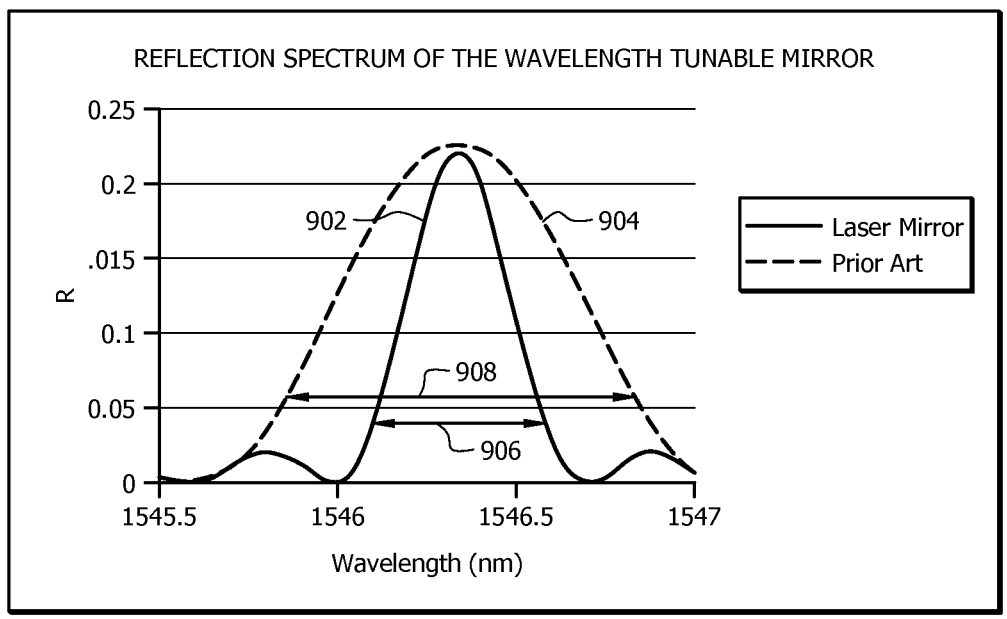

FIGS. 5A and 5B illustrate a comparison of the present embodiment of a laser mirror (as shown in FIG. 2) with a prior art example. The reflection spectrum of each is graphed, and it can be seen from the graph that the SMSR of the laser mirror is comparable to that of the prior art. Additionally, FIG. 5B illustrates that the width 906 of the center peak 902 (or the reflected spectrum width) for the laser mirror is less than the width 908 of the center peak 904 for the prior art example. The reduced reflected spectrum width may allow for adjustments to the optical path length of the laser cavity that would create a narrower line width in the laser. In the embodiment shown in FIGS. 5A and 5B, the prior art example is a modulated grating y-branch (MGY) laser.

Figure 6A:
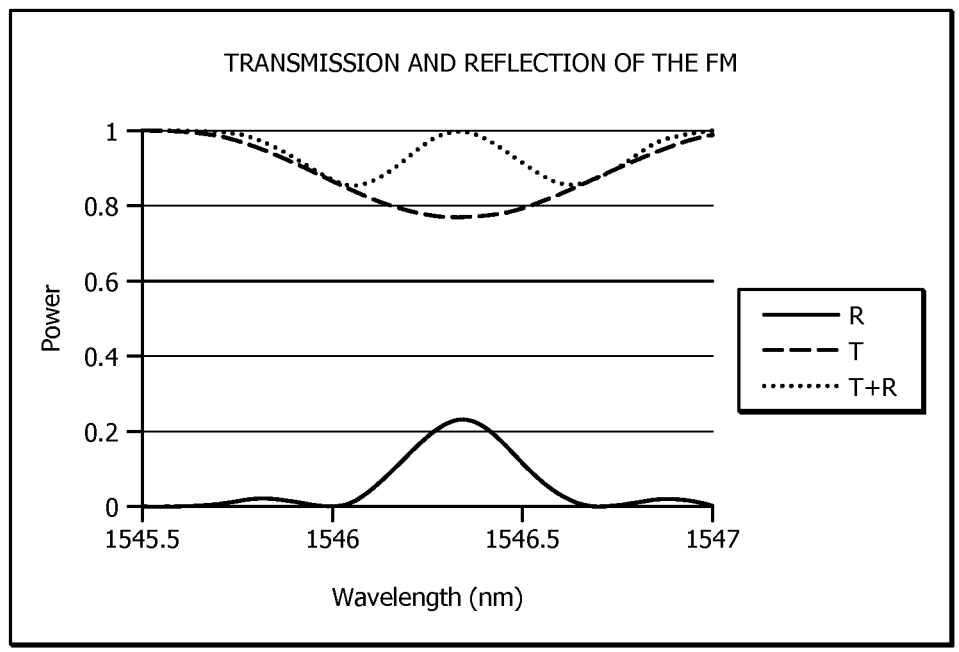
FIGS. 6A and 6B are graphs illustrating the transmission and reflection of an embodiment of an optical assembly.
Figure 6B:
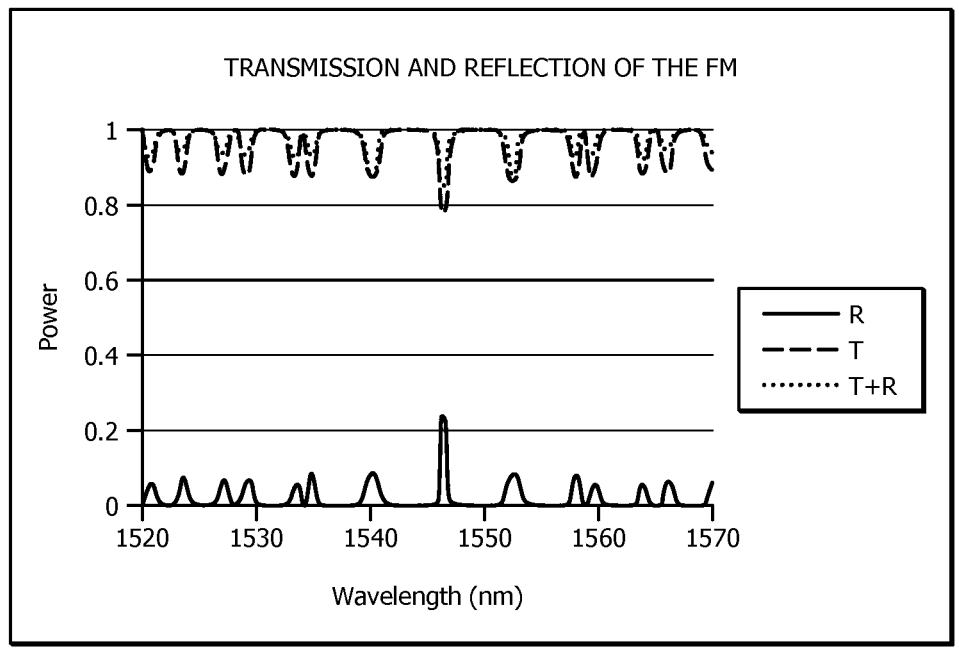

FIGS. 6A and 6B illustrate the power loss due to transmission (T) and reflection (R) of the laser mirror (FM). The graphs of FIGS. 6A and 6B are the same graph, wherein the scale of the x-axis for FIG. 6B has been increased. In principle, the laser mirror should have no power loss at the target wavelength. Therefore, the combination of the transmission power and the reflection power should equal one, or T+R=1, at the target wavelength. As can been seen from the graphs, at the target wavelength of approximately 1,546.3 nm, T+R is equal to one.

Figure 7A:
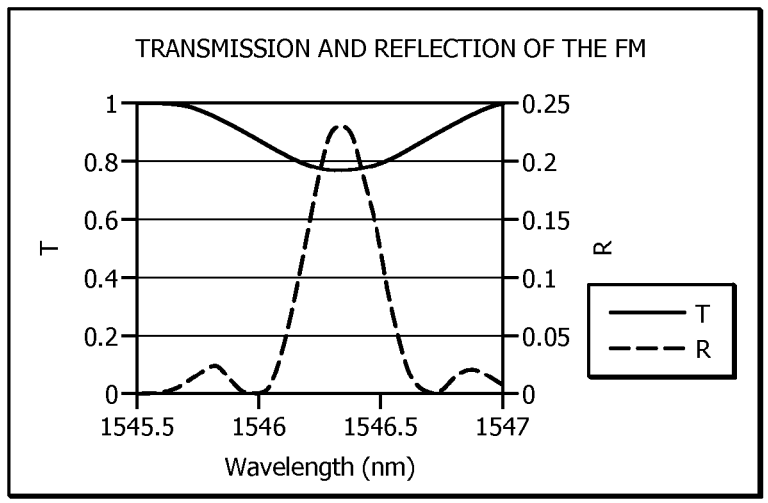
FIGS. 7A-7C are graphs illustrating the effects of phase change on the transmission of an embodiment of an optical assembly.
Figure 7B:
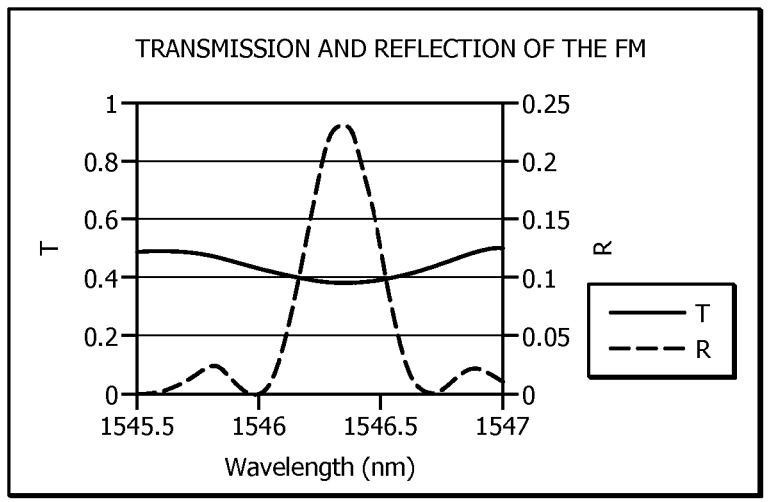
Figure 7C:
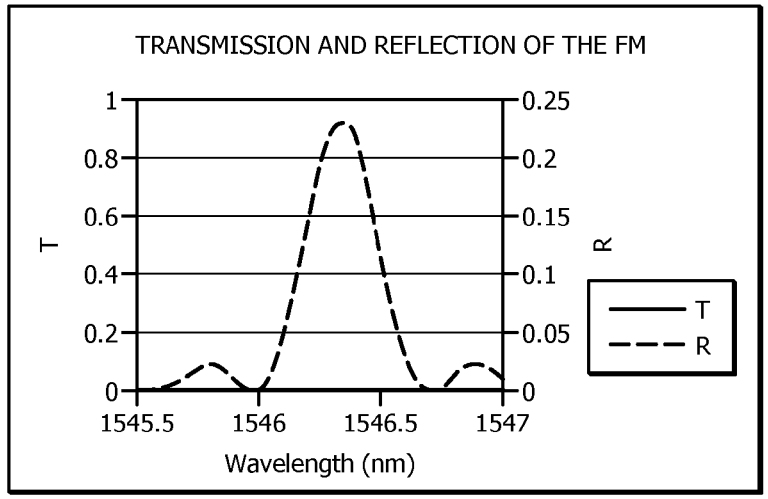

FIGS. 7A-7C illustrate the effects of adjusting the second delay line 246 on the transmission (or output power). Adjusting the reflective length by thermal tuning may change the optical path length of the second delay line 246, which may affect the phase difference between the two arms of the MZI. In FIG. 7A, the phase difference between the first arm of the MZI and the second arm of the MZI is approximately zero at the target wavelength. In FIG. 7B, the phase difference between the first arm of the MZI and the second arm of the MZI is approximately $\pi/2$ at the target wavelength. In FIG. 7C, the phase difference between the first arm of the MZI and the second arm of the MZI is approximately $\pi$ at the target wavelength.

Figure 8:
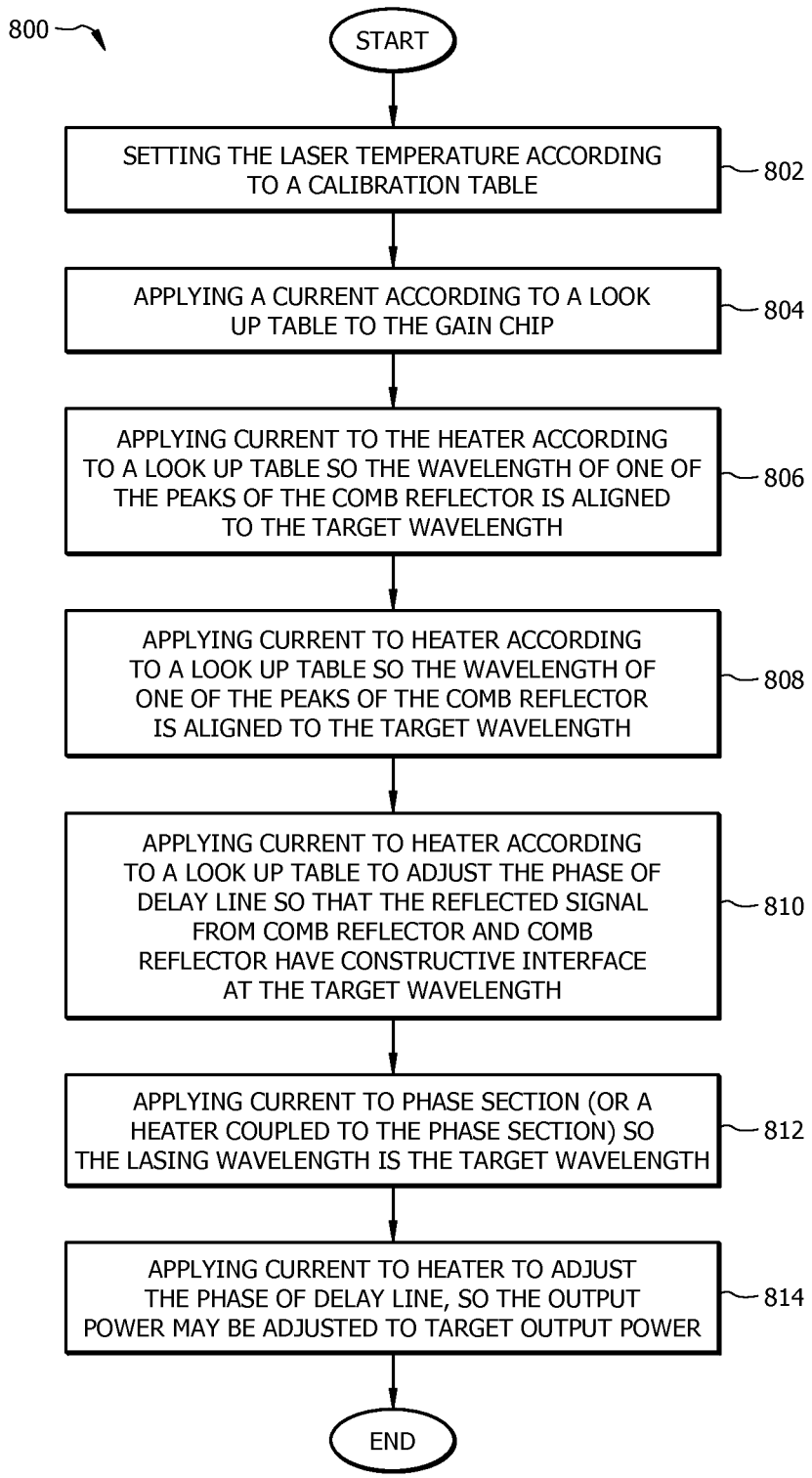
FIG. 8 is a flowchart of an embodiment of a method of tuning an optical signal.

FIG. 8 illustrates a method 800 for tuning a laser. The method 800 may comprise, at block 802, setting the laser temperature according to a calibration table. The method 800 may comprise, at block 804, applying a current according to a look up table to the gain chip 220. The method 800 may comprise, at block 806, applying current to the heater 243 according to a look up table so the wavelength of one of the peaks of the comb reflector 242 is aligned to the target wavelength. The method 800 may comprise, at block 808, applying current to heater 245 according to a look up table so the wavelength of one of the peaks of the comb reflector 244 is aligned to the target wavelength. The method 800 may comprise, at block 810, applying current to heater 241 according to a look up table to adjust the phase of delay line 240 so that the reflected signal from comb reflector 242 and comb reflector 244 have constructive interference at the target wavelength. The method 800 may comprise, at block 812, applying current to phase section 222 (or a heater coupled to the phase section 222) so the lasing wavelength is the target wavelength. The current on phase section 222 may be chosen according to a look up table or controlled with an external wavelength monitor. The method 800 may comprise, at block 814, applying current to heater 247 to adjust the phase of delay line 246, so the output power may be adjusted to a target output power. The current on heater 247 may be chosen according to a look up table or controlled with an external power monitor.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, e.g., k is 1 percent, 2 percent, 3 percent, 4 percent, 5 percent, . . . , 70 percent, 71 percent, 72 percent, . . . , 95 percent, 96 percent, 97 percent, 98 percent, 99 percent, or 100 percent. Moreover, any numerical range defined by two R numbers as defined in the above is also specifically disclosed. The use of the term "about" means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
an optical medium;
an input splitter coupled to the optical medium;
a first delay line coupled to the input splitter such that the input splitter is positioned between the first delay line and the optical medium;
a first comb reflector coupled to the first delay line such that the first delay line is positioned between the first comb reflector and the input splitter;
a second comb reflector coupled to the input splitter but not the first comb reflector and not the first delay line;
a second delay line coupled to the second comb reflector such that the second comb reflector is positioned between the second delay line and the input splitter;

an output combiner coupled to the first comb reflector and the second delay line; and an output optical medium coupled to the output combiner such that the output combiner is positioned between the first comb reflector and the output optical medium.

2. The apparatus of claim 1, further comprising an optical component network monolithically grown on an indium phosphide (InP) substrate platform.

3. The apparatus of claim 1, wherein the first comb reflector and the second comb reflector are configured to tune an output wavelength of a laser.

4. The apparatus of claim 1, wherein the first comb reflector and the second comb reflector each comprise one of a sampled grating distributed Bragg reflector (DBR) and a phase grating DBR.

5. The apparatus of claim 1, wherein the output optical medium comprises anti-reflective coating.

6. The apparatus of claim 1 further comprising one or more optical components coupled to the output optical medium.

7. The apparatus of claim 6, wherein the input splitter and the output combiner each comprise one of a multi-mode interface, a directional coupler, and a Y-branch splitter.

8. The apparatus of claim 1, further comprising:
a gain section coupled to the optical medium; and
a phase section coupled to the gain section such that the gain section is positioned between the optical medium and the phase section, wherein a facet of the phase section comprises high-reflection coating.

9. The apparatus of claim 1, further comprising a phase section coupled to the input splitter such that the phase section is positioned between the optical medium and the input splitter.

10. The apparatus of claim 1, further comprising an optical component network integrated on a silicon-on-insulator (SOI) substrate platform.

11. The apparatus of claim 10, wherein the optical component network is coupled to a gain chip grown on a separate indium phosphide (InP) substrate platform, and wherein the gain chip comprises high-reflection and anti-reflection coatings.

12. The apparatus of claim 1, wherein the first comb reflector, the second comb reflector, the first delay line, and the second delay line are temperature controlled through at least one local heater.

13. The apparatus of claim 1, wherein the first comb reflector, the second comb reflector, the first delay line, and the second delay line are controlled through current injection.

14. An apparatus comprising:
a laser phase section; and
a laser mirror coupled to the laser phase section and configured to:
apply a first current to a gain chip according to a first look up table;
apply a second current to a first heater according to a second look up table so that a first wavelength of a first peak of a first comb reflector is aligned to a target wavelength;
apply a third current to a second heater according to a third look up table so that a second wavelength of a second peak of a second comb reflector is aligned to the target wavelength;
apply a fourth current to a third heater according to a fourth look up table to adjust a first phase of a first delay line so that a first reflected signal from the first comb reflector and a second reflected signal from the second comb reflector have constructive interference at the target wavelength;
apply a fifth current to the laser phase section so that a lasing wavelength is the target wavelength; and
apply a sixth current to a fourth heater to adjust a second phase of a second delay line so that an output power is adjusted to a target output power.

15. The apparatus of claim 14, wherein the laser mirror is further configured to:
split an initial optical signal into a first optical signal and a second optical signal; and
direct the first optical signal through the first comb reflector and the first delay line.

16. The apparatus of claim 15, wherein the laser mirror is further configured to direct the second optical signal through the second delay line and the second comb reflector.

17. The apparatus of claim 16, wherein the laser mirror is further configured to:
combine the first optical signal and the second optical signal to create a combined optical signal; and
direct the combined optical signal through an output optical medium to an optical component network coupled to the output optical medium.

18. The apparatus of claim 14, wherein at least two of the first current, the second current, the third current, the fourth current, the fifth current, and the sixth current are the same.

19. The apparatus of claim 14, wherein at least two of the first look up table, the second look up table, the third look up table, and the fourth look up table are part of a same look up table.

20. The apparatus of claim 14, wherein the first phase and the second phase are the same.

21. A method comprising:
setting a laser temperature according to a calibration table;
applying a first current to a gain chip according to a first look up table;
applying a second current to a first heater according to a second look up table so that a first wavelength of a first peak of a first comb reflector is aligned to a target wavelength;
applying a third current to a second heater according to a third look up table so that a second wavelength of a second peak of a second comb reflector is aligned to the target wavelength;
applying a fourth current to a third heater according to a fourth look up table to adjust a first phase of a first delay line so that a first reflected signal from the first comb reflector and a second reflected signal from the second comb reflector have constructive interference at the target wavelength;
applying a fifth current to a phase section so that a lasing wavelength is the target wavelength; and
applying a sixth current to a fourth heater to adjust a second phase of a second delay line so that an output power is adjusted to a target output power.

22. The method of claim 21, wherein the fifth current is chosen according to a fifth look up table or controlled with an external wavelength monitor.

23. The method of claim 21, wherein the sixth current is chosen according to a sixth look up table or controlled with an external power monitor.

24. The method of claim 21, wherein at least two of the first current, the second current, the third current, the fourth current, the fifth current, and the sixth current are the same.

25. The method of claim 21, wherein at least two of the first look up table, the second look up table, the third look up table, and the fourth look up table are part of a same look up table.

26. The method of claim 21, wherein the first phase and the second phase are the same.

27. An apparatus comprising:

an optical medium;

an input splitter coupled to the optical medium;

a first delay line coupled to the input splitter such that the input splitter is positioned between the first delay line and the optical medium;

a first comb reflector coupled to the first delay line such that the first delay line is positioned between the first comb reflector and the input splitter;

a second comb reflector coupled to the input splitter but not the first comb reflector and not the first delay line;

a second delay line coupled to the second comb reflector such that the second comb reflector is positioned between the second delay line and the input splitter;

an output combiner directly coupled to the first comb reflector and the second delay line, wherein there are no components between the first comb reflector and the output combiner, and wherein the output combiner does not provide a gain; and an output optical medium coupled to the output combiner such that the output combiner is positioned between the first comb reflector and the output optical medium.

28. An apparatus comprising:

a first platform comprising a gain chip;

a second platform coupled to the first platform and comprising:

a first optical medium coupled to the gain chip;

a phase section coupled to the first optical medium;

an input splitter coupled to the phase section;

a first delay line coupled to the input splitter;

a first comb reflector coupled to the first delay line;

a second comb reflector coupled to the input splitter;

a second delay line coupled to the second comb reflector;

an output combiner coupled to the first comb reflector and the second delay line; and a second optical medium coupled to the output combiner.

29. The apparatus of claim 28, wherein the first platform comprises indium phosphide (InP) and the second platform comprises either silicon (Si) or silicon-on-insulator (SOI), and wherein the first platform and the second platform are coupled to each other via butt coupling.

30. The apparatus of claim 28, further comprising a plurality of optical components located on the second platform and coupled to the second optical medium.

31. The apparatus of claim 28, wherein the phase section, input splitter, first delay line, first comb reflector, second comb reflector, second delay line, output combiner, and second optical medium form a laser mirror.

\* \* \* \* \*